(12) United States Patent
Weksler et al.

(10) Patent No.: US 9,443,613 B2
(45) Date of Patent: Sep. 13, 2016

(54) ADVANCED MEMORY TEST DIAGNOSTICS

(71) Applicant: LENOVO (Singapore) PTE, LTD., New Tech Park (SG)

(72) Inventors: Arnold S. Weksler, Raleigh, NC (US); André Breda Carneiro, Trujillo (BR); Rodrigo Fernandes Freitas, Benfica (BR); Frederico Rhae Maciel Leal, Passaré (BR); Marcelo Araujo Lima, Fortaleza (BR); Fernando José Vieira da Silva, Tatuí (BR); Fernando Ferraz Silva, Sorocaba (BR); Francisco Plinio Oliveira Silveira, Qintino Cunha (BR)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 239 days.

(21) Appl. No.: 14/229,452

(22) Filed: Mar. 28, 2014

(65) Prior Publication Data
US 2015/0279485 A1 Oct. 1, 2015

(51) Int. Cl.
*G11C 29/18* (2006.01)
*G11C 29/10* (2006.01)
*G11C 29/44* (2006.01)

(52) U.S. Cl.
CPC ............... *G11C 29/18* (2013.01); *G11C 29/10* (2013.01); *G11C 29/44* (2013.01)

(58) Field of Classification Search
CPC ....... G11C 29/10; G11C 29/18; G11C 29/44; G11C 29/54
USPC ......................................................... 714/718
See application file for complete search history.

(56) References Cited

U.S. PATENT DOCUMENTS

| | | | |
|---|---|---|---|
| 5,856,982 A * | 1/1999 | So ........................... | G11C 29/10 365/201 |
| 6,622,272 B1 * | 9/2003 | Haverkamp ...... | G01R 31/31905 714/724 |
| 7,020,820 B2 * | 3/2006 | Caty ................ | G01R 31/31724 714/46 |
| 7,533,309 B2 * | 5/2009 | Mukherjee ..................... | 365/201 |
| 2007/0011511 A1 * | 1/2007 | Griseta .................. | G11C 29/10 714/718 |

OTHER PUBLICATIONS

Allen C. Cheng, "Comprehensive Study on Designing Memory BITS: Algorithms, Implementations and Trade-offs", Digital System Testing Project Report, EECS 579, Dec. 16, 2002.
Michael Barr, "Fast Accurate Memory Test Suite", http://www.barrgroup.com/Embedded-Systems/How-To/Memory-Test-Suite-C, Jan. 30, 2014.

(Continued)

*Primary Examiner* — David Ton
(74) *Attorney, Agent, or Firm* — Kunzler Law Group

(57) ABSTRACT

For performing advanced memory test diagnostics, an apparatus, method, and computer program product are disclosed. The apparatus may include a processor, a memory that stores code executable by the processor, an address space module that identifies an address space having a plurality of blocks of memory addresses, a memory diagnostic module that performs, at least three times, a memory test procedure using a block pattern, wherein a first block pattern is used the first time, a second block pattern is used the second time, and a third block pattern is used the third time, and a memory fault module that determines the presence of a memory fault based on results of the memory test procedures.

20 Claims, 8 Drawing Sheets

(56) References Cited

OTHER PUBLICATIONS

Marc Riedel et al., "Fault Coverage Analysis of RAM Test Algorithms", paradise.caltech.edu/~riedel/research/ramflt.ppt, Aug. 27, 2011.
L. Dilillo et al., "March iC-: An Improved Version of March C- for ADOFs Detection", VLSI Test Symposium, 2004. Proceedings. 22nd IEEE.
Ad J. Van De Goor, "Using March Tests to Test SRAMs", IEEE Design & Test of Computers, vol. 10, Issue 1, Mar. 1993.
"Memory Testing", University of Cincinnati—ECE, known about as early as Jan. 30, 2014.
Memory Testing, University of Toronto, ECE 1767, known about as early as Jan. 30, 2014.
"MemTest86 Technical Information", PassMark Software, Jan. 30, 2014.
Mudapu Paravathi et al., "Modified March C- Algorithm for Embedded Memory Testing", International Journal of Electrical and Computer Engineering, vol. 2, No. 5, Oct. 2012, pp. 571-576.
Cheng-Wen Wu, "Testing Semiconductor Memories", Lab for Reliable Computing Dept. Electrical Engineering National Tsing Hua University, Jun. 2011.

* cited by examiner

ADVANCED MEMORY TEST DIAGNOSTICS

BACKGROUND

1. Field

The subject matter disclosed herein relates to memory diagnostics and more particularly relates to advanced memory test diagnostics.

2. Description of the Related Art

Hardware defects in memory devices are common, as they are composed of memory cells that may be affected by electrical problems, such as short circuits or open circuits. These electrical problems can cause several different memory faults in the memory devices. Memory tests exist to detect the presence of these memory faults, however existing memory test are typically slow. Additionally, existing memory tests fail to uncover some types of memory faults and/or have no guarantee of a running time limit.

BRIEF SUMMARY

An apparatus for performing advanced memory test diagnostics is disclosed. A method and computer program product also perform the functions of the apparatus.

The apparatuses may include a processor, a memory that stores code executable by the processor, the code including code that identifies an address space having a plurality of blocks of memory addresses, code that performs, at least three times, a memory test procedure using a block pattern, wherein a first block pattern is used the first time, a second block pattern is used the second time, and a third block pattern is used the third time, and code that determines the presence of a memory fault based on results of the memory test procedures.

The methods may include identifying, using a processor, an address space having a plurality of blocks of memory addresses, performing, at least three times, a memory test procedure using a block pattern, wherein a first block pattern is used the first time, a second block pattern is used the second time, and a third block pattern is used the third time, and tracking errors detected during the plurality of test procedures. Performing the memory test procedure in the address space may include testing a subset of the blocks of memory addresses of the address space using the block pattern.

The computer program products may include a computer readable storage medium that stores code executable by a processor to perform identifying an address space having a plurality of memory chunks, performing, at least three times, a memory test procedure using a block pattern, wherein a first block pattern is used the first time, a second block pattern is used the second time, and a third block pattern is used the third time, tracking errors detected during the memory test procedures, and determining the presence of a memory fault based on the tracked errors.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
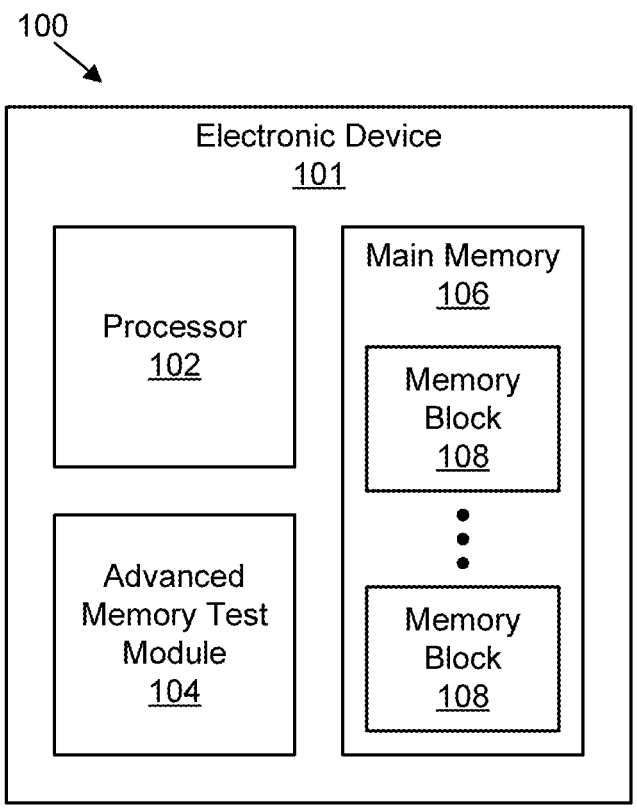
FIG. 1 is a schematic block diagram illustrating one embodiment of a system for performing advanced memory test diagnostics.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Java, Smalltalk, C++ or the like and conventional procedural programming languages, such as the "C" programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Generally, the disclosed systems, apparatuses, methods, and computer program products identify an address space in a computer memory, perform—at least three times—a memory test procedure on the computer memory using a block pattern, wherein a first block pattern is used the first time, a second block pattern is used the second time, and a third block pattern is used the third time, and determine the presence of memory faults in the computer memory based on results of the memory test procedures.

The system memory typically includes an array of memory cells, each storing a data value, which may be affected by electric issues, such as short or open circuits. Electrical problems in the system memory prevent correct data storage and/or access, thereby causing several different memory storage errors (i.e., memory faults). These faults include stuck-at faults (where a memory cell always holds the same value), transition faults (where a memory cell fails to undergo a value transition), coupling faults (where a write operation to one memory cell affects a value stored in an adjacent cells), data retention faults (where a memory cell loses its value over time due to power leaks), read random faults (where a memory cell returns a random value when read), and addressing faults (where multiple memory cells may be accessed through the same address, multiple addresses may point to the same cell, or a cell may never be accessed). Memory faults can prevent instructions from being properly executed and/or corrupt data values leading to system instability and crashes, thereby preventing a computing device from functioning as designed. It is, therefore, desirable to test for faults and, where possible, to remedy them.

The apparatuses may include a processor, a memory that stores code executable by the processor, the code including code that identifies an address space having a plurality of blocks of memory addresses, code that performs, at least three times, a memory test procedure using a block pattern, wherein a first block pattern is used the first time, a second block pattern is used the second time, and a third block pattern is used the third time, and code that determines the presence of a memory fault based on results of the memory test procedures.

In some embodiments, the apparatuses include code that tracks errors detected during the memory test procedures, wherein the code that determines the presence of memory faults includes code that determines the presence of a memory fault based on the tracked errors. The determined memory fault may be selected from the group including of a stuck-at fault, a transition fault, a coupling fault, a data retention fault, a read random fault, and an addressing fault.

In some embodiments, the apparatuses include code that clears the plurality of blocks of memory addresses, in response to identifying the address space and code that clears the plurality of blocks of memory addresses, in response to performing the memory test procedures on the address space using the first pattern.

In some embodiments, the apparatuses include code that writes a complement of the second block pattern to the blocks of memory addresses in response to performing the memory test procedure using the first pattern and code that writes a complement of the third block pattern to the blocks of memory addresses in response to performing the memory test procedure using the second pattern.

The code that performs the memory test procedure using a block pattern may include code that tests sequential blocks of memory addresses of the address space in an increasing manner using the block pattern, code that tests sequential blocks of memory addresses of the address space in an increasing manner using a complement of the block pattern, code that tests sequential blocks of memory addresses of the address space in a decreasing manner using the block pattern, and code that tests sequential blocks of memory addresses of the address space in a decreasing manner using the complement of the block pattern.

The code that tests blocks of memory addresses of the address space may include code that writes a value to each block of memory addresses, the written value being one of the block pattern or the complement of the block pattern, code that reads data values in each block of memory addresses, and code that determines, for each block of memory addresses whether the read data values matches the written value.

The first block pattern may match the second block pattern and the third block pattern may be different than both the first block pattern and the second block pattern. For example, the first and second block patterns may be the eight byte value 0xAAAAAAAAAAAAAAAA and the third block pattern may be the eight byte value 0xFFFFFFFFFFFFFFFF.

The methods may include identifying, using a processor, an address space having a plurality of blocks of memory addresses, performing, at least three times, a memory test procedure using a block pattern, wherein a first block pattern is used the first time, a second block pattern is used the second time, and a third block pattern is used the third time, and tracking errors detected during the plurality of test procedures. Performing the memory test procedure in the address space may include testing a subset of the blocks of memory addresses of the address space using the block pattern.

In some embodiments, the methods may include determining the presence of a memory fault based on the tracked errors, wherein the determined memory fault is selected from the group including of a stuck-at fault, a transition fault, a coupling fault, a data retention fault, a read random fault, and an addressing fault.

Performing the memory test may include testing sequential blocks of memory addresses of the address space in an increasing manner using a block pattern, testing sequential blocks of memory addresses of the address space in an increasing manner using a complement of the block pattern, testing sequential blocks of memory addresses of the address space in a decreasing manner using the block pattern, and testing sequential blocks of memory addresses of the address space in a decreasing manner using the complement of the block pattern.

Testing blocks of memory addresses may include writing a value to each block of memory addresses, the written value being one of the block pattern or the complement of the block pattern, reading data values in each block of memory addresses, and determining, for each block of memory addresses whether the read data values matches the written value. Each block of memory addresses may have a size of eight bytes and the first block pattern, the second block pattern, and the third block pattern may each have a size of eight bytes.

In some embodiments, the methods may include clearing the plurality of blocks of memory addresses, in response to identifying the address space, verifying that the plurality of blocks of memory addresses are cleared. In some embodiments, the methods include clearing the plurality of blocks of memory addresses, in response to performing the memory test procedures on the address space using the first pattern, and verifying that the plurality of blocks of memory addresses are cleared.

In some embodiments, the methods may include writing a complement of the second block pattern to the blocks of memory addresses in response to performing the memory test procedure using the first pattern, and writing a complement of the third block pattern to the blocks of memory addresses in response to performing the memory test procedure using the second pattern.

The computer program products may include a computer readable storage medium that stores code executable by a processor to perform identifying an address space having a plurality of memory chunks, performing, at least three times, a memory test procedure using a block pattern, wherein a first block pattern is used the first time, a second block pattern is used the second time, and a third block pattern is used the third time, tracking errors detected during the memory test procedures, and determining the presence of a memory fault based on the tracked errors.

The code to perform a memory test procedure using a block pattern may include code to perform testing sequential memory chunks in the address space using the block pattern and testing sequential memory chunks in the address space using the complement of the block pattern.

FIG. 1 depicts a system 100 for performing advanced memory test diagnostics. In the embodiments of FIG. 1, the system 100 includes an electronic device 101. Examples of electronic devices include desktop, laptop, tablet, and handheld computers, mobile phones, smartphones, servers, and the like. As depicted the electronic device 101 includes a processor 102, an advanced memory test module 104, and a main memory 106. The main memory 106 may include a plurality of memory blocks 108. The main memory 106 may also include code and/or data for one or more programs and/or processes running on the electronic device 101, such an operating system and/or another application. Components of the electronic device 101 may be interconnected by a communication medium, such as a computer bus.

The processor 102 may comprise any known controller capable of executing computer-readable instructions and/or capable of performing logical operations on the input text. For example, the processor 102 may be a microcontroller, a microprocessor, a central processing unit (CPU), a graphics processing unit (GPU), an auxiliary processing unit, a FPGA, or similar programmable controller. The processor 102 reads (i.e., loads into registers) and executes instructions (i.e., program code) stored in the main memory 106 to perform the methods and routines described herein. In some embodiments, the processor 102 includes a processor cache that loads instructions and/or data from the main memory 106 for execution by the processor 102.

The advanced memory test module 104, in one embodiment, identifies an address space, performs multiple memory test procedures in the address space using a test pattern, and determines the presence of memory faults in the address space. In some embodiments, the advanced memory test module 104 tracks errors detected during the memory test procedures and determines the presence of memory faults based on the tracked errors. The address space may include multiple memory blocks 108, the memory blocks 108 being the same size as the test pattern. When performing the memory test procedure, the advanced memory test module 104 may write the test pattern to each memory block 108 in the address space and verify the data stored in each memory block 108. When performing the memory test procedure, the advanced memory test module 104 may also write the complement of the test pattern to each memory block 108 and verify the data stored in each memory block 108. In some embodiments, a different test pattern (and pattern complement) is used in the different ones of the multiple test procedures.

In some embodiments, the advanced memory test module 104 clears the memory blocks 108 in the address space before and/or after performing the memory test procedure. In further embodiments, the advanced memory test module 104 clears the memory blocks 108 before and after the first one of the multiple memory test procedures. In some embodiments, the advanced memory test module 104 writes the pattern complement to the memory blocks 108 in the address space before and/or after performing one of the memory test procedure. In further embodiments, the advanced memory test module 104 writes the pattern complement to the memory blocks 108 before and after the second one of the multiple memory test procedures.

In some embodiments, the advanced memory test module 104 locks the one or more memory blocks 108 in the address space prior to performing the memory test procedure. The advanced memory test module 104 is described further below with reference to FIGS. 2 and 3.

The main memory 106, in one embodiment, is the primary memory of the electronic device 101. The main memory 106 is directly accessible by the processor 102 and may include one or more memory modules. Each memory module in the main memory 106 includes an array of memory cells, each storing a data value. In some embodiments, the main memory 106 is subdivided into a plurality of memory blocks 108.

In certain embodiments, the main memory 106 comprises a volatile computer readable storage medium. For example, the main memory 106 may be a random access memory (RAM), including dynamic RAM and/or static RAM, or another suitable memory device. In some embodiments, the memory 106 contains an operating system as well as program code and/or data for one or more applications actively running on the electronic device 101. The operating system provides an interface between applications and the hardware, such as the main memory 108, of the electronic device 101. In other embodiments, no operating system is present in the electronic device 101, the advanced memory test module 104 interacting directly with the main memory 106.

Electrical problems in the main memory 106 prevent correct data storage and/or access, thereby causing several different memory faults (i.e., memory storage errors). Memory faults can prevent instructions from being properly executed and/or corrupt data values leading to system instability and crashes, thereby preventing the electronic device 101 from functioning as designed. The advanced memory test module 104 is configured to diagnose memory faults in the main memory 106.

In some embodiments, the main memory 106 may be supplemented by a data storage device. The least-used memory blocks 108 (e.g., pages) of the main memory 106 may be swapped (i.e., paged) into the data storage device and later loaded back into the main memory 106 as needed, thereby allowing utilization of more primary storage capacity than is physically available in the main memory 106.

The data storage device, in one embodiment, is a non-volatile (i.e., persistent) computer readable storage medium storing data and/or program code. The data and/or program code may be operated on by the processor 102, and is loaded into the main memory 106 prior to operation by the processor 102. The data storage device may be a hard disk drive, a flash memory, and/or another suitable non-volatile re-writable computer storage device.

The memory blocks 108, in one embodiment, are chunks of memory in the main memory 106. The memory blocks 108 store data and may be used by processes and/or programs running on the electrical device 101. The memory blocks 108 may correspond to a page, section, or other division of memory address space in the main memory 106. When the advanced memory test module 104 identified an address space, it identifies one or more of the memory blocks 108 having a memory address within the range defined by the address space.

In some embodiments, the operating system and/or applications are able to run on the processor 102 while the advanced memory test module 104 diagnoses the main memory 106 for memory faults. In some embodiments, the advanced memory test module 104 may be configured to interrupt the applications using memory blocks 108 in the address space, page any program code and/or data associated with the applications to a data storage device, and perform advanced memory test diagnostics on the freed memory blocks 108.

Figure 2:
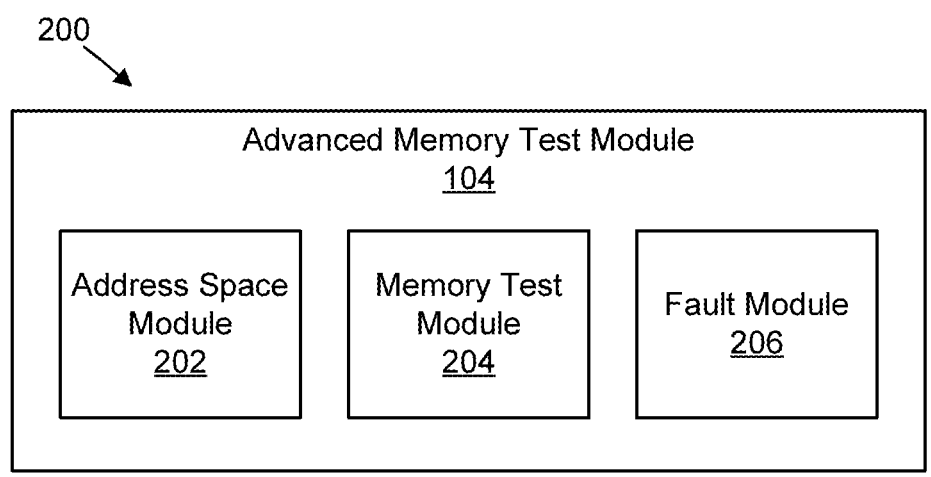
FIG. 2 is a schematic block diagram illustrating one embodiment of an apparatus for performing advanced memory test diagnostics.

FIG. 2 depicts an apparatus 200 for allocating computer memory for memory diagnostics, according to embodiments of the disclosure. Apparatus 200 comprises an advanced memory test module 104 described above with reference to FIG. 1. In general, as described above, the advanced memory test module 104 may identify an unreserved amount of a computer memory, request a portion of the computer memory based on the unreserved amount, and determine if an allocated portion of the memory includes non-contiguous memory addresses. In the embodiments of FIG. 2, the advanced memory test module 104 includes an address space module 202, a memory diagnostic module 204, and a memory fault module 206. Components of the advanced memory test module 104 may be communicatively coupled to each other and may pass information to each other.

The address space module 202, in one embodiment, is configured to identify an address space in the main memory 106 comprising a plurality of blocks of memory addresses 108. In some embodiments, the address space module 202 queries the main memory 106 to identify an address space. In some embodiments, the address space module 202 queried an operating system to identify the address space in the main memory 106. In further embodiments, the address space module 202 use an interface, such as a memory module API, to query the main memory 106 and/or the memory manager 112 to identify the address space. The address space may comprise all or a portion of the memory blocks 108 in the main memory 106. In some embodiments, the address space excludes memory blocks allocated to the operating system.

In embodiments, the address space module 202 requests a portion of the main memory 106 and identifies the memory allocation as the address space. When requesting memory, the address space module 202 may request all or a portion of the available (free) memory blocks 108 in the main memory 106.

The memory diagnostic module 204, in one embodiment, is configured to perform a plurality of memory test procedures on the identified address space using a block pattern. The memory test procedure is performed at least three times on the memory blocks 108 in the address space to ensure that all memory locations in the address space are exercised sufficiently to detect stuck-at faults, transition faults, coupling faults, read random faults, and the like. In some embodiments, the memory diagnostic module 204 varies the block pattern between successive iterations of the memory test procedure. For example, a first pattern may be used on the first and second iterations, or passes, of the memory test procedure, while a different pattern may be used on a third or successive iteration.

The block pattern comprises a plurality of bits. Adjacent bits in the block pattern may have the same value or may have alternating values. Examples of test patterns include the hexadecimal values of "AAAA", "6666", "CCCC", "FFFF", and the like. Patterns with alternating bits allow for quicker detection of memory storage error, leading to quicker diagnosis of memory faults. In some embodiments, the memory diagnostic module 204 uses the block pattern and the block pattern's complement. The pattern complement is the inverse binary value of the block pattern. For example, the hexadecimal pattern "AAAA" (i.e., binary value of "1010101010101010") has a complement (i.e., inverse) of "5555" (i.e., binary value of 0101010101010101"). By using both the block pattern and the pattern complement, the memory diagnostic module 204 ensures that all possible values are written to (and read from) each memory location in the address space.

The memory diagnostic module 204 performs the memory test procedure by writing the block pattern to memory blocks 108 and verifying that the data retrieved from the memory blocks 108 match the block pattern. Typically, a memory test procedure writes and reads values for all memory blocks 108 in the address space in either an ascending or a descending order. For example, an address space that includes all addresses between "000" and "FFF" could be tested starting at "FFF" and decrementing the address until reaching "000". In some embodiments, values are written to all memory blocks 108 in the memory space before reading data from the address space. In some embodiments, values are written and verified on a block-by-block basis, each memory block 108 being the same length as the block pattern. That is, the written value has a length of one memory block 108, the expected value has a length of one memory block 108, and the test procedure increments (or decrements) memory addresses one memory block 108 at a time.

In some embodiments, the memory block 108 length is based on the architecture of the processor 102. For example, the memory block 108 length may be 32 bits (i.e., 4 bytes) when the processor 102 is a 32-bit microprocessor and the memory block 108 length may be 64 bits (i.e., 8 bytes) when the processor 102 is a 64-bit microprocessor. In other embodiments, the memory block 108 length is based on a page size of the main memory 106. For example, if the main memory 106 is divided into 4 kB pages, each memory block 108 corresponds to a 4 kB page in the main memory 106.

In some embodiments, the memory diagnostic module 204 increments the memory addresses less than the size of the memory block 108 so that successive written block patterns overlap previous written block patterns. For example, the memory block 108 may be eight bytes long, but the memory address is incremented only four bytes between successive writes. The block pattern may include a first half and a second half and the read pattern (i.e., expected value) would be only the first half of the block pattern. For example, for a four byte block pattern of "AAAA CCCC" would correspond to a read pattern of "AAAA AAAA" as the second half of the block pattern (i.e., "CCCC") would be overwritten by the first half (i.e., "AAAA") during successive writes. Overlapping the block patterns would exercise (i.e., switch from "0" to "1" or vice versa) each memory location to a greater degree than a single write-verify and do so in less time than verifying after each write.

In some embodiments, the memory diagnostic module 204 performs the memory test procedure by writing a value to a memory location multiple times to detect transition faults, coupling faults, read random faults, and the like. In some embodiments, a data value is read from a particular memory block 108 before writing the block pattern to the particular memory block 108 a successive time. In other embodiments, the block pattern is written to a memory block 108 multiple times before values are read from the memory block 108. In some embodiments, values are written and data is read from the address space in the same order (i.e., both ascending or both descending). In other embodiments, values are written to the address space in one order (e.g., ascending) and data is read from the address space in the opposite order (e.g., descending). Varying the order that memory addresses are accessed allows memory addressing faults to be more quickly and accurately determined. Examples of memory test procedures are described below with reference to FIGS. 7 and 8.

The memory diagnostic module 204 detects a memory storage error when the value read from a memory block 108 does not match the expected values (e.g., the block pattern). In some embodiments, the memory diagnostic module 204 may flag the memory block 108 and pass information to the memory fault module 206 regarding the location, read value, and/or expected value to the memory fault module 206 in response to the read value not matching the expected value. After passing along information related to the memory storage error, the memory diagnostic module 204 proceeds to test the next memory block 108 in the address space.

In some embodiments, the memory diagnostic module 204 writes a specific value to each memory block 108 in the address space before and/or after performing a memory test procedure. For example, the pattern complement may be written to the memory blocks 108 before and after the second iteration of the memory test procedure. In further embodiments, the memory blocks 108 in the address space may be cleared (e.g., set to "0") before and/or after a memory test procedure. For example, the memory blocks 108 may be cleared before and after the first iteration of the memory test procedure. In some embodiments, the memory diagnostic module 204 locks the address space prior to performing the memory test procedure to prevent the memory blocks 108 in the address space from being swapped into secondary storage.

The memory fault module 206, in one embodiment, is configured to determine whether a memory fault is present in the address space based on the results of the memory test procedures. In some embodiments, the memory fault module 206 analyzes instances where the read value does not match the expected values (e.g., the block pattern) for a specific memory block 108 to detect the presence of a memory fault. The memory fault module 206 may further analyze these instances to determine a memory address associated with the memory fault and/or a memory fault type.

In certain embodiments, the memory fault module 206 tracks errors uncovered by the memory diagnostic module 204. The memory diagnostic module 204 may provide the memory fault module 206 with memory locations (i.e., memory block 108 identifiers, memory addresses, or the like), expected values, and/or read values when the memory diagnostic module 204 determines a memory storage error the memory test procedure(s). In some embodiments, the memory fault module 206 also records memory locations physically and/or logically adjacent to the memory block 108 having a tracked error. The memory fault module 206 uses the information associated with the tracked error to determine memory addresses and/or fault types associated with the memory faults.

Figure 3:
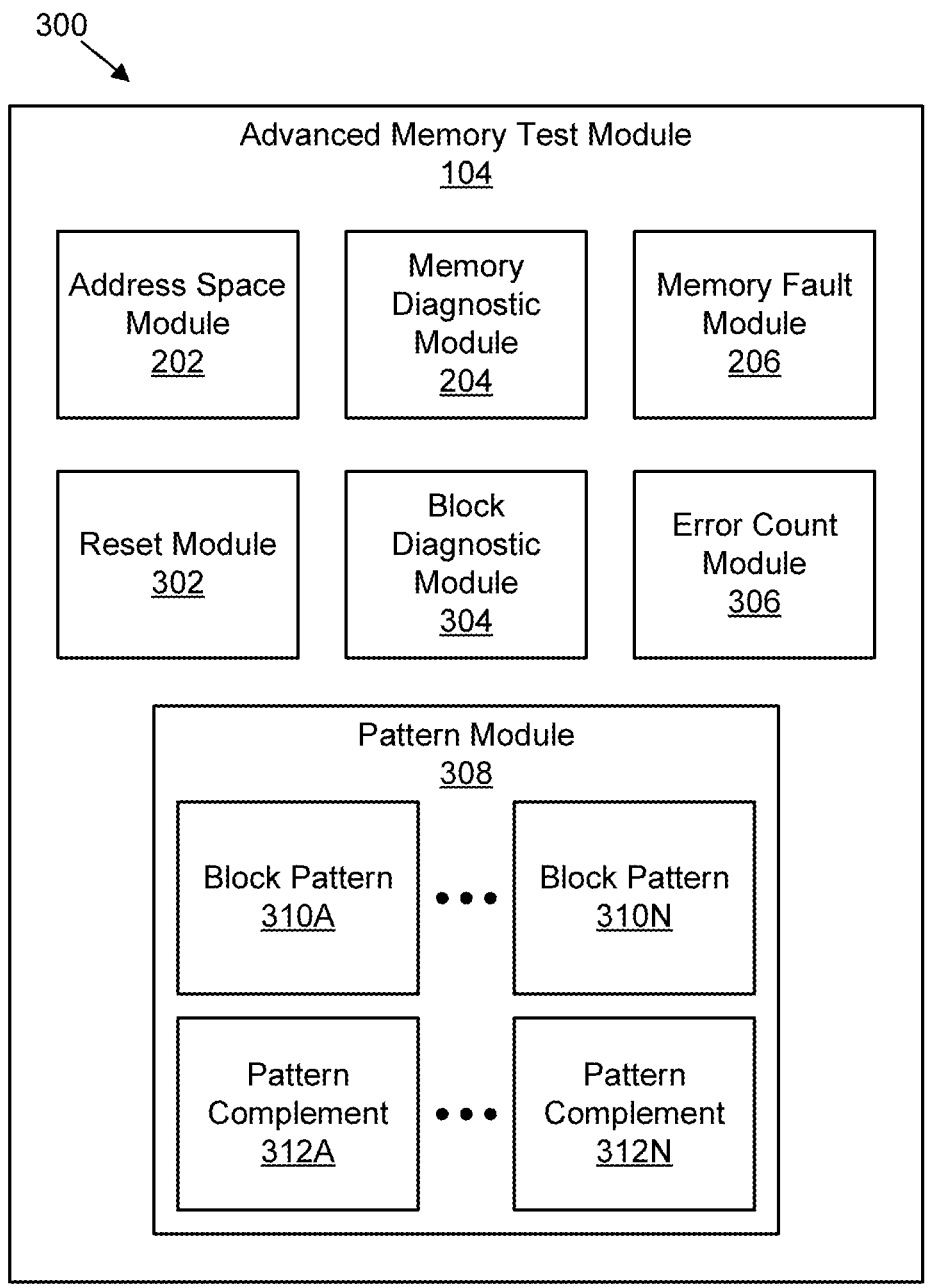
FIG. 3 is a schematic block diagram illustrating another embodiment of an apparatus for performing advanced memory test diagnostics.

FIG. 3 depicts an apparatus 300 for allocating computer memory for memory diagnostics, according to embodiments of the disclosure. Apparatus 300 comprises an advanced memory test module 104, such as the advanced memory test module 104 described above with reference to FIGS. 1 and 2. In general, as described above, the advanced memory test module 104 may identify an unreserved amount of a computer memory, request a portion of the computer memory based on the unreserved amount, and determine if an allocated portion of the memory includes non-contiguous memory addresses. The advanced memory test module 104 may include an address space module 202, a memory diagnostic module 204, and a memory fault module 206, as described above with reference to FIG. 2. Additionally, in the embodiments of FIG. 3, the advanced memory test module 104 includes a reset module 302, a block diagnostic module 304, an error count module 306, and a pattern module 308. Components of the apparatus 300 may be communicatively coupled to each other and may pass information to each another.

The reset module 302, in one embodiment, is configured to write a specific value to each memory block 108 in the address space. In some embodiments, the reset module 302 is a component of the memory diagnostic module 204. In other embodiments, the reset module 302 operates separately from the memory diagnostic module 204. In certain embodiments, the reset module 302 writes the specific value to each memory block in response to identifying the address space. In certain embodiments, the reset module 302 writes the block pattern or the pattern complement to each memory block in response to the memory diagnostic module 204 completing an iteration of the memory test procedure. In further embodiments, the reset module 302 writes the pattern complement to the memory blocks 108 before the second one of the multiple memory test procedures.

In some embodiments, the reset module 302 is further configures to clear each memory block 108 in the address space. In certain embodiments, the reset module 302 clears each memory block in response to identifying the address space. In certain embodiments, the reset module 302 clears each memory block in response to the memory diagnostic module 204 completing an iteration of the memory test procedure. In further embodiments, the reset module 302 clears the memory blocks 108 before and after the first one of the multiple memory test procedures. In some embodiments, the reset module 302 verifies that each memory block 108 is cleared. Clearing a memory block 108 may include writing a "0" to the memory block 108. Clearing a memory block 108 may include setting the memory block 108 to a lowest power state. The reset module 302 may clear successive memory blocks 108 in the address space in an increasing manner (e.g., an ascending order) or in a decreasing manner (e.g., a descending order).

The block diagnostic module 304, in one embodiment, is configured to test a memory block 108 for a memory storage fault. In some embodiments, the block diagnostic module 304 is a component of the memory diagnostic module 204. In other embodiments, the block diagnostic module 304 operates separately from the memory diagnostic module 204. The block diagnostic module 304 writes either the block pattern or the pattern complement a memory block 108. Then the block diagnostic module 304 reads a data value from the memory block 108 and determines whether the read data matches the written value (i.e., either the block pattern or the pattern complement). If the read data matches the written value then the memory block 108 passes. Else, if the read data does not match the written value, then a memory storage error is present in the memory block 108. The block diagnostic module 304 may pass information regarding the memory storage error to the memory diagnostic module 204, the memory fault module 206, and/or the error count module 306 in response to detecting the memory storage error.

In some embodiments, the block diagnostic module 304 writes to all memory blocks 108 in the address space before reading data from the memory blocks 108. In some embodiments, the block diagnostic module 304 writes to and/or reads from the memory blocks 108 in an ascending manner or in a descending manner.

The error count module 306, in one embodiment, is configured to track memory storage errors occurring in the memory blocks 108 of the address space. In some embodiments, the error count module 306 is a component of the memory diagnostic module 204 and/or the memory fault module 206. In other embodiments, the error count module 306 operates separately from the memory diagnostic module 204 and/or the memory fault module 206. The error count module 306 may store information related to each occurrence of a memory storage error including the memory block 108 in which the error occurs, memory blocks 108 physically and/or logically adjacent to the memory block 108 in which the error occurs, the value written to the memory block 108, and the value read from the memory block 108. The error count module 306 may provide the information related to the memory storage errors to the memory fault module 206 for determination of memory faults.

The pattern module 308, in one embodiment, is configured to store a plurality of block patterns 310A-310N and corresponding pattern complements 312A-312N. The pattern module 308 is further configured to provide one of the block patterns 310A-310N to the memory diagnostic module 204 for performing an iteration of the memory test procedure. In some embodiments, the pattern module 308 also provides a corresponding one of the pattern complements 312A-312N to the memory diagnostic module 204 for the memory test procedure.

The block pattern 310A comprises a plurality of bits in a pattern configured to detect memory storage errors. The block pattern 310N is the Nth block pattern stored in the pattern module 308. In some embodiments, N corresponds to the number of memory test procedures the memory diagnostic module 204 is configured to perform. The pattern complement 312A is the complement (i.e., binary inverse) of block pattern 310A and the pattern complement 312N is the complement of block pattern 310N. In some embodiments, the block pattern 310N differs from the block patter 310A. For example, block pattern 310A may have the value of "AAAA" (the pattern complement 312A being "5555") and the block pattern 310N may have a value of "FFFF" (the pattern complement 312N being "0000"). As another example, block pattern 310A may be "AAAA" and the block pattern 310N may be "CCCC".

Figure 4A:
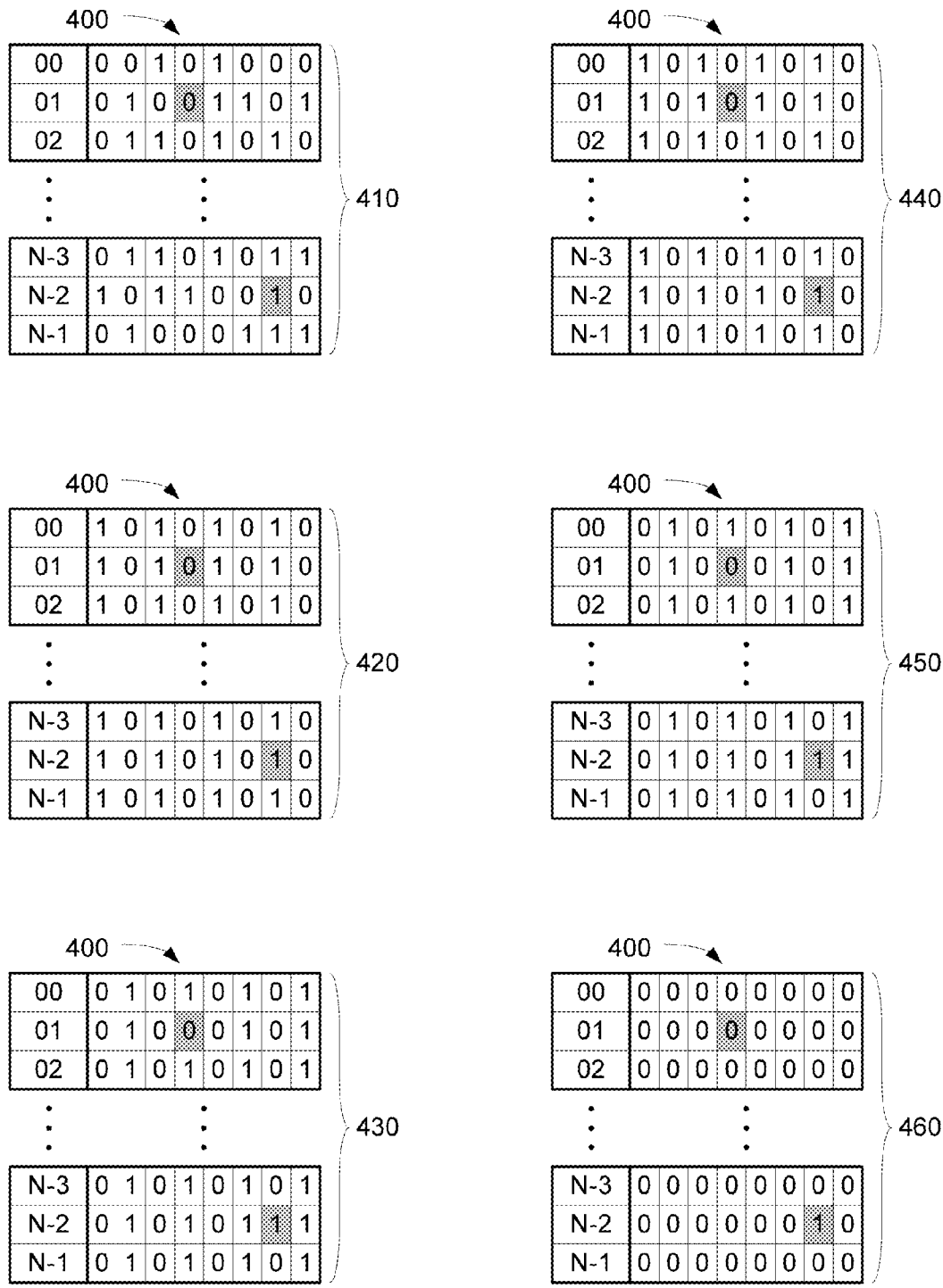
FIG. 4A is a diagram illustrating one embodiment of an address space at various states in the advanced memory test diagnostic.

FIG. 4A depicts an address space 400, according to embodiments of the disclosure. The address space 400 is shown in various states 410-460 during a memory test procedure. In the embodiment of FIG. 4A, the address space 400 comprises N number of memory blocks, each memory block having an identifier and contains eight memory cells allowing the memory block to hold one byte (eight bits) of memory. While each memory block may contain more memory cells, eight are shown for simplicity of illustration.

As shown, the memory block identifier may be a number identifying the memory block, a first memory block having the "00" identifier and the Nth memory block having an identifier equal to N−1. In other embodiments, the memory block identifier may be the memory address of the first location in the memory block. The "01" memory block has a faulty memory cell (indicated by shading) and the "N−2" memory block has a faulty memory cell. In the embodiments of FIG. 4A, the faulty cells exhibit a stuck-at fault for simplicity of illustration.

State 410 depicts an initial state of the address space 400. In state 410, the values stored in each memory block are not uniform. The values in each memory block were written by other programs and/or processes and will be changed as the memory test procedure progresses. The faulty cell of the "01" memory block is stuck at a value of "0" and the faulty cell of the "N−2" memory block is stuck at a value of "1".

State 420 depicts the address space 400 after the memory test procedure writes a first pattern to each memory block in the address space 400. As depicted, the first pattern comprises "10101010" (i.e., "0xAA" in hexadecimal). Due to the location of the faulty memory cells in the memory blocks, writing the first pattern to the memory blocks will not result in a data storage error. That is to say that the data read from each memory block will match the expected values (i.e., the first pattern).

State 430 depicts the address space 400 after the memory test procedure writes the compliment of the first pattern (i.e., the first pattern complement) to each memory block in the address space 400. As depicted, the first pattern complement comprises "01010101" (i.e., "0x55" in hexadecimal). Here the data read from the "01" memory block (i.e., "01000101") will not match the written value ("01010101") and the memory test procedure will detect the memory storage error at the "01" memory block. Additionally, the data read from the "N−2" memory block (i.e., "01010111") will not match the written value ("01010101") and the memory test procedure will detect the memory storage error at the "N−2" memory block.

State 440 depicts the address space 400 after the memory test procedure writes a second pattern to each memory block in the address space 400. As depicted, the second pattern comprises "10101010" (i.e., "0xAA" in hexadecimal) and is the same as the first pattern. However, in alternative embodiments the second pattern may comprise another alternating pattern that differs from the first pattern, such as "11001100" (i.e., "0xCC" in hexadecimal). Again, due to the locations of the faulty memory cell in the "01" and the "N−2" memory blocks, writing the second pattern to the memory blocks will not result in a data storage error as the data read from each memory block will match the expected values (i.e., the second pattern). However, in the alternative embodiments, a different test pattern may cause a data storage error at the "01" or "N−2" memory blocks.

State 450 depicts the address space 400 after the memory test procedure writes the complement of the second pattern (i.e., the second pattern complement) to each memory block in the address space 400. Again, the data read from the "01" memory block (i.e., "01000101") and the data read from the "N−2" memory block (i.e., "01010111") will not match the written value ("01010101") and the memory test procedure will detect the memory storage errors. However, in the alternative embodiments, a different test pattern may not cause a data storage error in the "01" or "N−2" memory blocks.

State 460 depicts the address space 400 after the memory test procedure clears the address space 400. As depicted, the "01" memory block shows clear (i.e., a value of "0") while the "N−2" memory block shows a value of "2". As the "N−2" memory block has a value other than "0", the memory test procedure will detect the memory storage error at the "N−2" memory block.

Analysis of the memory storage errors detected during the memory test procedure(s) will determine that a stuck-at fault occurs in the fifth memory cell from the right in the "01" memory block and in the second memory cell from the right in the "N−2" memory block. In some embodiments, the analysis is performed by a memory fault module 206.

Figure 4B:
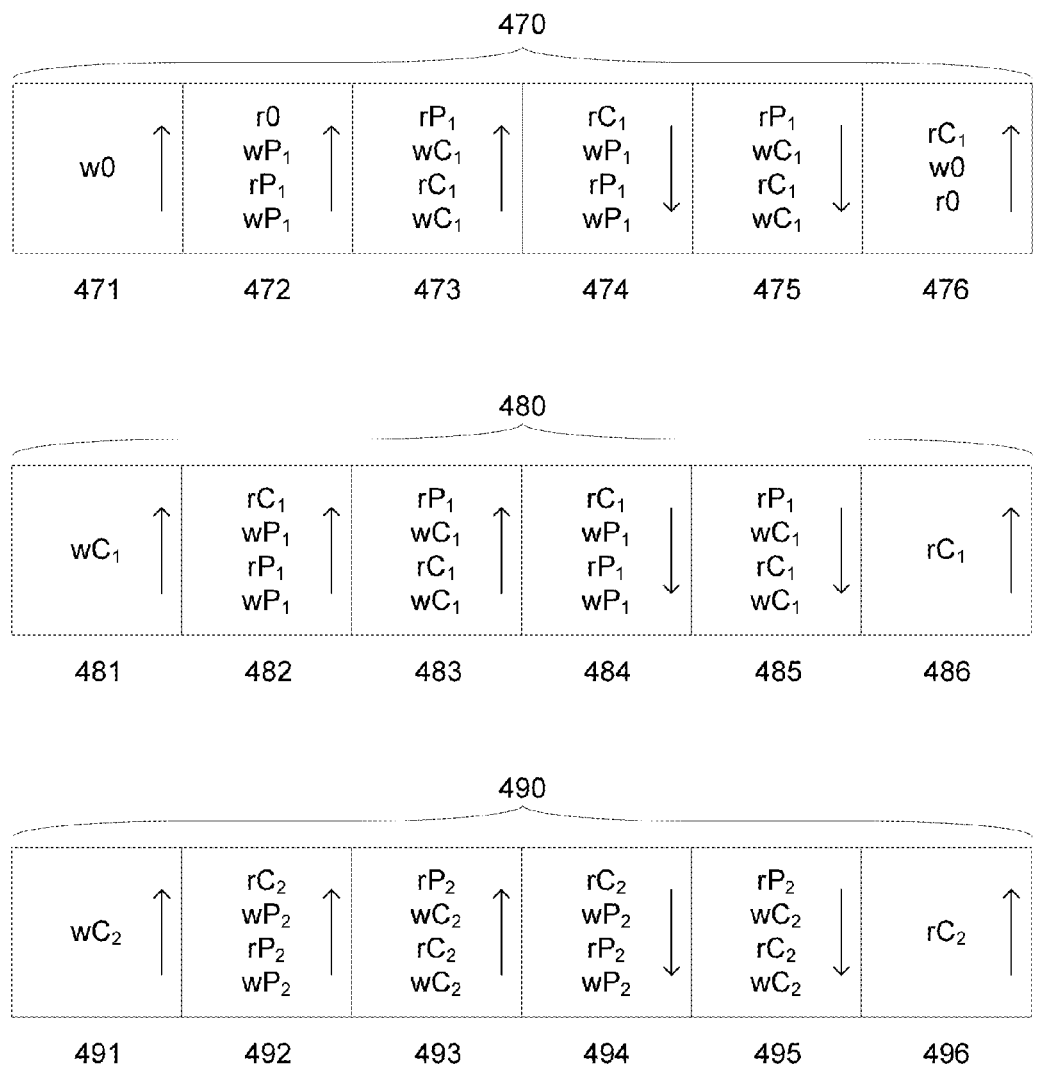
FIG. 4B is a diagram illustrating one embodiment of a battery of memory test procedures for advanced memory test diagnostics.

FIG. 4B depicts a representation of a plurality of memory test procedures 470-490. The first memory test procedure 470 is divided into six logical steps 471-476. At step 471, a "0" is written to each memory block in the address space in ascending address order (i.e., in an incrementing manner), clearing the address space. At step 472, the "0" is read (i.e., verified), a first block pattern ($P_1$) is written to each memory block in the address space, the first block pattern is read (i.e., verified), and written again to each memory block. Step 472 occurs in ascending address order. At step 473, the first block pattern is read (i.e., verified), a first pattern complement ($C_1$) is written to each memory block in the address space, the first pattern complement is read (i.e., verified), and the first pattern complement is written again to each memory block. Step 473 also occurs in ascending address order.

At step 474, the first pattern complement is read (i.e., verified), the first block pattern is written to each memory block in the address space, the first block pattern is read (i.e., verified), and written again to each memory block. Step 474 occurs in descending address order (i.e., in a decrementing manner). At step 475, the first block pattern is read (i.e., verified), the first pattern complement is written to each memory block in the address space, the first pattern complement is read (i.e., verified), and the first pattern complement is written again to each memory block. Step 475 also occurs in descending address order. At step 476, the first pattern complement is read (i.e., verified), a "0" is written to each memory block in the address space, and the "0" is read (i.e., verified). Step 476 occurs in ascending address order.

The second memory test procedure 480 is divided into six logical steps 481-486. At step 481, the first pattern complement ($C_1$) is written to each memory block in the address space, in ascending address order (i.e., in an incrementing manner). At step 482, the first pattern compliment is read (i.e., verified), a first block pattern ($P_1$) is written to each memory block in the address space, the first block pattern is read (i.e., verified), and written again to each memory block. Step 482 occurs in ascending address order. At step 483, the first block pattern is read (i.e., verified), a first pattern complement is written to each memory block in the address space, the first pattern complement is read (i.e., verified), and the first pattern complement is written again to each memory block. Step 483 also occurs in ascending address order.

At step 484, the first pattern complement is read (i.e., verified), the first block pattern is written to each memory block in the address space, the first block pattern is read (i.e., verified), and written again to each memory block. Step 484 occurs in descending address order (i.e., in a decrementing manner). At step 485, the first block pattern is read (i.e., verified), the first pattern complement is written to each memory block in the address space, the first pattern complement is read (i.e., verified), and the first pattern complement is written again to each memory block. Step 485 also occurs in descending address order. At step 486, the first pattern complement is read (i.e., verified). Step 486 occurs in ascending address order.

The third memory test procedure 490 is divided into six logical steps 491-496. At step 491, a second pattern compliment ($C_2$) is written to each memory block in the address space in ascending address order, clearing the address space. At step 492, the second pattern compliment is read (i.e., verified), a second block pattern ($P_1$) is written to each memory block in the address space, the second block pattern is read (i.e., verified), and written again to each memory block. Step 492 occurs in ascending address order. At step 493, the second block pattern is read (i.e., verified), a second pattern complement is written to each memory block in the address space, the second pattern complement is read (i.e., verified), and the second pattern complement is written again to each memory block. Step 493 also occurs in ascending address order.

At step 494, the second pattern complement is read (i.e., verified), the second block pattern is written to each memory block in the address space, the second block pattern is read (i.e., verified), and written again to each memory block. Step 494 occurs in descending address order. At step 495, the second block pattern is read (i.e., verified), the second pattern complement is written to each memory block in the address space, the second pattern complement is read (i.e., verified), and the second pattern complement is written again to each memory block. Step 495 also occurs in descending address order. At step 496, the second pattern complement is read (i.e., verified). Step 496 occurs in ascending address order.

Figure 5:
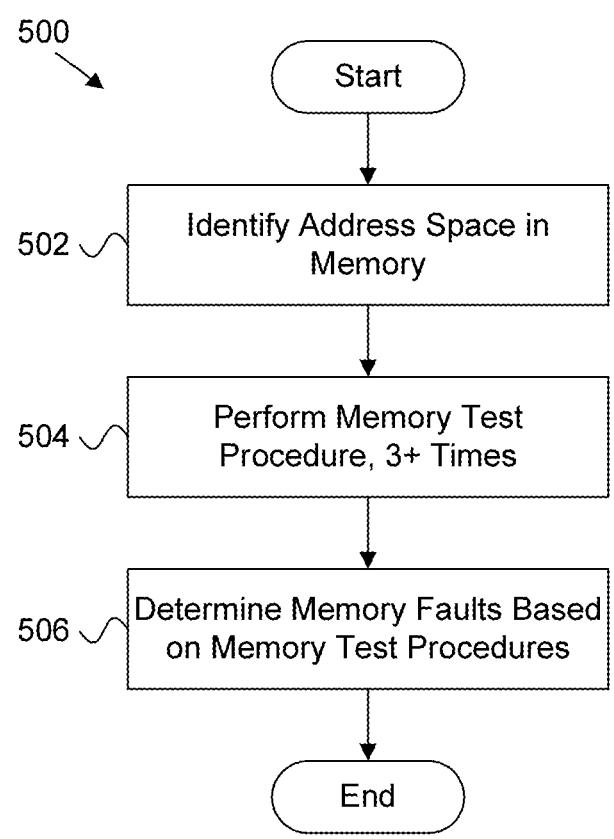
FIG. 5 is a schematic flow chart diagram illustrating one embodiment of a method for performing advanced memory test diagnostics.

FIG. 5 depicts a method 500 for performing advanced memory test diagnostics, according to embodiments of the disclosure. In some embodiments, the method 500 is performed by an advanced memory test device, such as the advanced memory test module 104 described above with reference to FIGS. 1-3. In further embodiments, the method 500 is performed by a processor executing program code, such as the processor 102 described above with reference to FIG. 1.

The method 500 begins with the advanced memory test device identifying 502 an address space in a system main memory. In some embodiments, an operating system, such as the operating system 110 described above, is queried to identify 502 an address space for memory diagnostics. In other embodiments, where no operating system is present, the memory modules are directly queried to identify 502 an address space for memory diagnostics. In some embodiments, the advanced memory test device may request allocation of an address space in the main memory, for example via the operating system. For example, the operating system may include a memory management function that allocates memory responsive to requests by programs and/or processes. In some embodiments, identifying 502 the address space in the system memory includes verifying that the address space and/or an allocated portion of the memory includes physical, contiguous memory addresses.

Next, the advanced memory test device performs 504 a memory test procedures on the allocated portion of memory. The memory test procedure is performed at least three times on the memory locations in the address space. The memory test procedure is used to detect for various memory faults including, but not limited to, stuck-at faults, transition faults, coupling faults, data retention faults, read random faults, and addressing faults.

Performing 504 the memory test procedure comprises writing values to location in memory and verifying that the data retrieved from the locations matches the written values. Typically, a memory test procedure writes and reads values for all memory locations in the address space in either an ascending or a descending order. For example, an address space that includes all addresses between "000" and "FFF" could be tested starting at "FFF" and decrementing the address until reaching "000". In some embodiments, values are written to all addresses in the memory space before reading data from the address space. In some embodiments, values are written and verified on a word-by-word basis, the word being a collection of bits. That is, the written value has a length of one word, the expected value has a length of one word, and the test procedure increments (or decrements) memory addresses one word at a time. In some embodiments, the word length is based on the architecture of the processor 102. For example, the word length may be 32 bits (i.e., 4 bytes) when the processor 102 is a 32-bit microprocessor and the word length may be 64 bits (i.e., 8 bytes) when the processor 102 is a 64-bit microprocessor.

In some embodiments, the memory test procedure uses a pattern to test the memory locations in the address space. The pattern comprises a plurality of bits and neighboring bits may have the same value or may have alternating values. Examples of test patterns include the hexadecimal values of "AAAA", "6666", "CCCC", "FFFF", and the like. Patterns with alternating bits allow for quicker detection of memory storage error, leading to quicker diagnosis of memory faults. In some embodiments, the memory test procedure uses a pattern and the pattern's complement. The complement is the inverse binary value of the pattern. For example, the hexadecimal pattern "AAAA" (i.e., binary value of "1010101010101010") has a complement (i.e., inverse) of "5555" (i.e., binary value of 0101010101010101"). By using both the pattern and the complement, the memory test procedure ensures that all possible values are written to (and read from) each memory location in the address space. Examples of memory test procedures are discussed below with reference to FIGS. 7 and 8.

In some embodiments, the memory location increments a number of addresses less than the size of the pattern so that successive written patterns overlap previous written patterns. For example, the write pattern may be eight bytes long, but the memory address is incremented only four bytes between successive writes. The write pattern may include a first half and a second half and the read pattern (i.e., expected value) would be only the first half of the write pattern. For example, for a four byte write pattern of "AAAA CCCC" would correspond to a read pattern of "AAAA AAAA" as the second half of the write pattern (i.e., "CCCC") would be overwritten by the first half (i.e., "AAAA"). Overlapping the write patterns would exercise each memory location to a greater degree than a single write-verify and do so in less time than verifying after each write.

In some embodiments, the pattern used by the memory test procedure varies between successive performances 504 (i.e., iterations) of the memory test procedure. For example, a first pattern may be used on the first and second iterations, or passes, of the memory test procedure, while a different pattern may be used on a third or successive iteration.

Typically, performing 504 the memory test procedure includes writing a value to a memory location multiple times to detect transition faults, coupling faults, read random faults, and the like. In some embodiments, a data value is read from a particular memory location before writing a value to the particular memory location a successive time. In other embodiments, data values are written multiple times before values are read from a memory location. In some embodiments, values are written and data is read from the address space in the same order (i.e., both ascending or both descending). In other embodiments, values are written to the address space in one order (e.g., ascending) and data is read from the address space in the opposite order (e.g., descending). Varying the order that memory addresses are accessed allows memory addressing faults to be more quickly and accurately determined.

The memory test procedure is performed 504 three time to ensure that all memory locations in the address space are exercised (i.e., switched from "0" to "1" and vice versa) sufficiently to detect stuck-at faults, transition faults, coupling faults, read random faults, and the like. For a memory location initially storing a value of "1", writing a "1" to that location is less useful than writing a value "0" for detecting certain faults. Thus, each memory location should be exercised, that is cycled between "0" and "1", a sufficient number of times to detect memory faults.

In some embodiments, a specific value may be written to each memory location in the address space before and/or after performing 504 memory test procedure. In further embodiments, the values in the address space may be cleared (e.g., set to "0") before and/or after a performing 504 a memory test procedure.

In some embodiments, detected errors are tracked while performing 504 the memory test procedure(s). One or more memory locations associated with the error may also be tracked to aid in determining memory faults. For example, memory locations physically and/or logically adjacent to a memory location reading an erroneous value may be recorded for further analysis. In further embodiments, the written and/or read values for the memory locations associated with the error may be recorded for further analysis. If an error is detected (i.e., if a read value differs from the corresponding write value), the advanced memory test device records (tracks) the error and proceeds to test the next memory location in the address space.

In some embodiments, the address space is locked into main memory prior to performing 504 the memory test procedure. Locking the address space prevents it from being swapped into secondary storage, and ensures that only the main memory 106 is tested. In some embodiments, the advanced memory test device locks the allocated memory via the operating system and/or the memory management function.

Next, the advanced memory test device determines 506 whether any memory faults are present based on results of the memory test procedures. In some embodiments, the advanced memory test device determines 506 whether memory faults are present by analyzing errors tracked during the memory test procedure. In certain embodiments, data relating to the read and/or write value may be used to determine a particular memory fault associated with a memory location. In certain embodiments, data values of neighboring memory locations may be used to determine a particular memory fault associated with a particular memory location. The method 500 ends.

Figure 6:
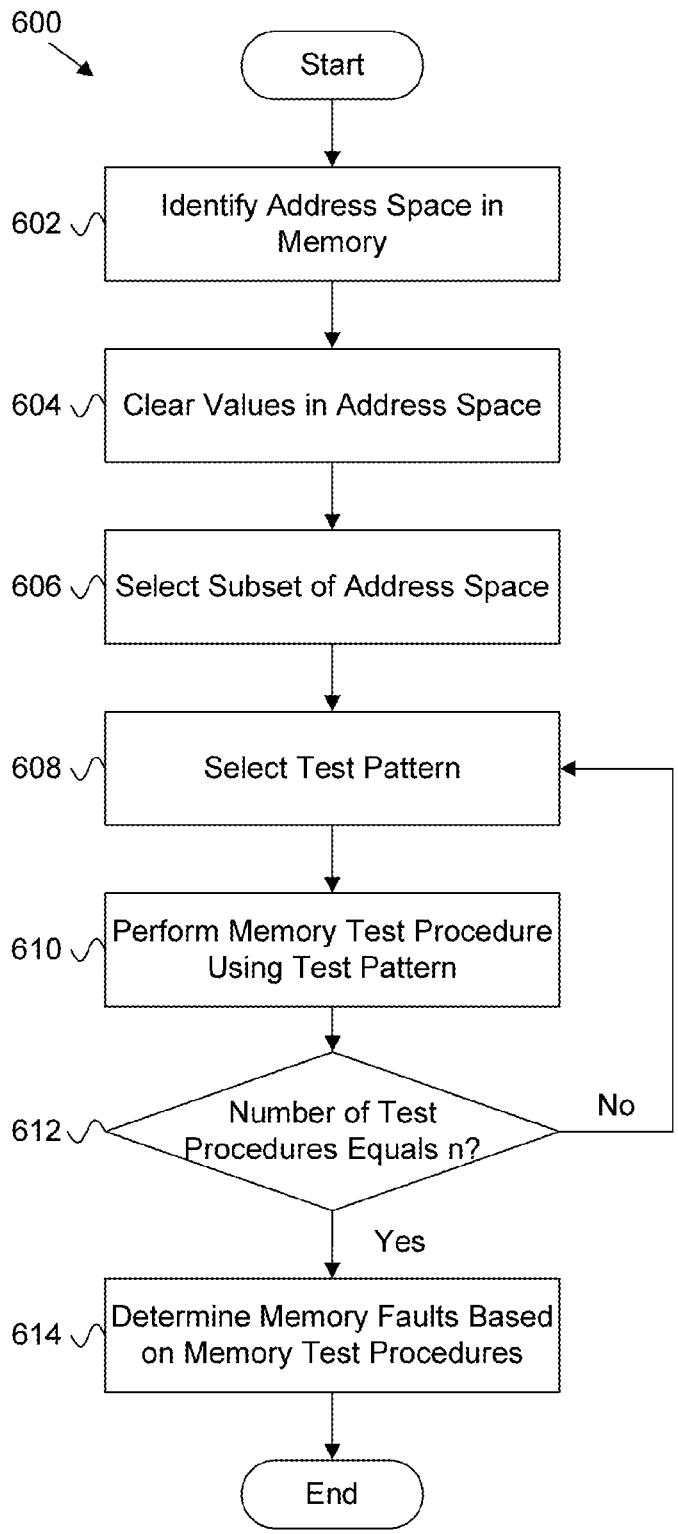
FIG. 6 is a schematic flow chart diagram illustrating another embodiment of a method for performing advanced memory test diagnostics.

FIG. 6 depicts a method 600 for performing advanced memory test diagnostics, according to embodiments of the disclosure. In some embodiments, the method 600 is performed by an advanced memory test device, such as the advanced memory test module 104 described above with reference to FIGS. 1-3 and 5. In further embodiments, the method 600 is performed by a processor executing program code, such as the processor 102 described above with reference to FIG. 1.

The method 600 begins with the advanced memory test device identifying 602 an address space in a system main memory. In some embodiments, an operating system, such as the operating system 110 described above, is queried to identify 602 an address space for memory diagnostics. In some embodiments, the advanced memory test device may request allocation of an address space in the main memory via the operating system. For example, the operating system may include a memory management function that allocates memory responsive to requests by programs and/or processes. In some embodiments, identifying 602 the address space in the system memory includes verifying that the address space and/or an allocated portion of the memory includes physical, contiguous memory addresses.

Next, the advanced memory test device clears 604 the values at all memory locations in the address space. The values existing in the memory space may not be known when the method 600 begins and clearing 604 the values ensures that all memory locations in the subset are uniform. In some embodiments, clearing 604 the values enhances the effectiveness of the memory test procedure in detecting memory storage errors. In some embodiments, clearing 504 the memory includes verifying that the memory locations are cleared, thereby allows for easy detection of transition faults. In certain embodiments, clearing 604 the values comprises setting each memory location to a lowest powered state. In certain embodiments, clearing 604 the values comprises writing a "0" to each memory location. The successively addressed memory locations in the address space may be cleared 604 in an increasing order or in a decreasing order.

Next, the advanced memory test device selects 606 a subset of the address space for memory test diagnosis. Selecting the subset allows the memory test to run quickly, but cannot not guarantee that all memory locations are thoroughly tested. In some embodiments, the subset is selected 608 in a random fashion. In some embodiments, a different subset is selected before each memory test procedure. In some embodiments, a statistically significant portion of the address space is selected 608 as the subset, the size of the subset being a balance of testing speed and likelihood of discovering an existing memory fault at a specific location. In some embodiments, the first selected subset comprises the entirety of the address space while subsequently subsets include less than the entirety of the address space.

In some embodiments, the selected 608 subset includes portions of the address space where memory storage error were detected in previous memory test procedures. For example, if a first memory test procedure discovers a memory storage error at a memory address "0x0080", the subset selected 608 for subsequent memory test procedures may include the address "0x0080" and other addresses that are logically and/or physically adjacent to "0x0080". In some embodiments, the subset may exclude memory addresses that are logically and physically distant from a memory location having a memory storage error.

Next, the advanced memory test device selects 608 a test pattern for testing each memory location in the selected subset of the address space. The test pattern comprises a plurality of bits and is used by the memory test procedure to test for memory faults in the address space. The adjacent bits in the pattern may have the same value or may have alternating values. Examples of test patterns include the hexadecimal values of "AAAA", "6666", "CCCC", "FFFF", and the like. Patterns with alternating bits allow for quicker detection of memory storage errors, leading to quicker diagnosis of memory faults. In some embodiments, the memory test procedure uses a test pattern and the pattern's complement. The complement is the inverse binary value of the pattern. For example, the hexadecimal pattern "AAAA" (i.e., binary value of "1010101010101010") has a complement (i.e., inverse) of "5555" (i.e., binary value of 0101010101010101"). By using both the pattern and the complement, the memory test procedure ensures that all possible values are written to (and read from) each memory location in the address space.

The test pattern is selected before each memory test procedure and the test pattern may vary between successive memory test procedures. In some embodiments, a first test pattern is used for the first memory test procedure, a second test pattern is used for the second memory test procedure, a third pattern is used for the third memory test procedure, and so on. For example, the first test pattern may be the hexadecimal value "AAAA" while the second test pattern is "CCCC". As another example, the first test pattern may be "AAAA" while the third test pattern is "FFFF". Varying the test pattern allows for detection of certain types of memory faults, such as coupling faults, data retention faults, read random faults, and the like.

Next, the advanced memory test device performs 610 a memory test procedures on the allocated portion of memory. The memory test procedure is performed at least three times on the memory locations in the address space. The memory test procedure is used to detect for various memory faults including, but not limited to, stuck-at faults, transition faults, coupling faults, data retention faults, read random faults, and addressing faults.

Performing 610 the memory test procedure comprises writing values to location in memory and verifying that the data retrieved from the locations matches the written values. Typically, a memory test procedure writes and reads values for all memory locations in the address space in either an ascending or a descending order. For example, an address space that includes all addresses between "000" and "FFF" could be tested starting at "FFF" and decrementing the address until reaching "000". In some embodiments, values are written to all addresses in the memory space before reading data from the address space. Values are written and verified on a block-by-block basis, the block size being the same as the selected pattern. For example, where the selected pattern is 8-bytes in length, the block size would also be 8-bytes. The pattern length may be based on the architecture of the processor 102. Examples of memory test procedures are discussed below with reference to FIGS. 7 and 8.

Typically, the memory test procedure writes a value to a memory location multiple times to detect transition faults, coupling faults, read random faults, and the like. In some embodiments, a data value is read from a particular memory location before writing a value to the particular memory location a successive time. In other embodiments, data values are written multiple times before values are read from a memory location. In some embodiments, values are written and data is read from the address space in the same order (i.e., both ascending or both descending). In other embodiments, values are written to the address space in one order (e.g., ascending) and data is read from the address space in the opposite order (e.g., descending). In this way, memory addressing faults may more quickly determined by varying the address order.

In some embodiments, detected errors are tracked while performing 610 the memory test procedure(s). One or more memory locations associated with the error may also be tracked to aid in determining memory faults. For example, memory locations physically and/or logically adjacent to a memory location reading an erroneous value may be recorded for further analysis. In further embodiments, the written and/or read values for the memory locations associated with the error may be recorded for further analysis. If an error is detected (i.e., if a read value differs from the corresponding write value), the advanced memory test device records (tracks) the error and proceeds to test the next memory location in the address space.

In some embodiments, the address space is locked into main memory prior to performing 610 the memory test procedure. Locking the address space prevents it from being swapped into secondary storage, and ensures that only the main memory 106 is tested. In some embodiments, the advanced memory test device locks the allocated memory via the operating system and/or the memory management function.

Next, the advanced memory test device determines 612 whether the number of memory test procedures performed 610 is equal to a predetermined amount "n". In some embodiments, "n" is equal to three. In other embodiments, "n" may be greater than three, however the larger the value of "n" the more time it will take for the advanced memory test device to detect and analyze memory faults. The amount "n" should be selected to ensure that memory locations in the address space (or subset) are exercised (i.e., switched from "0" to "1" and vice versa) sufficiently to detect stuck-at faults, transition faults, coupling faults, read random faults, and the like. The amount "n" should be the lowest number that will guarantee that a certain percentage of memory faults will be detected.

Next, the advanced memory test device determines 614 whether any memory faults are present based on results of the memory test procedures. In some embodiments, the advanced memory test device determines 614 whether memory faults are present by analyzing errors tracked during the memory test procedure. In certain embodiments, data relating to the read and/or write value may be used to determine 614 a particular memory fault associated with a memory location. In certain embodiments, data values of neighboring memory locations may be used to determine 614 a particular memory fault associated with a particular memory location. The method 600 ends.

Figure 7:
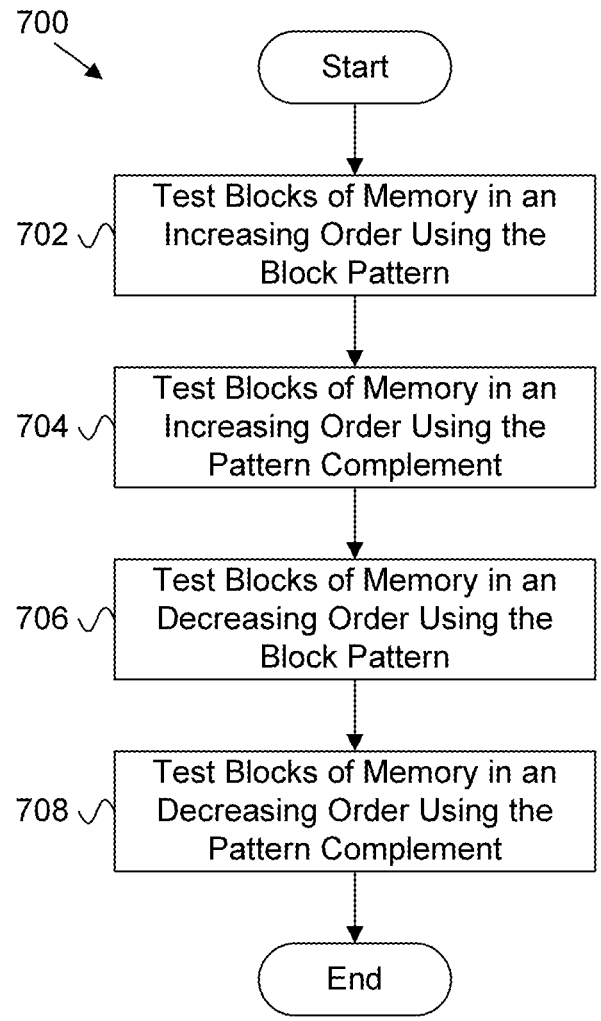
FIG. 7 is a schematic flow chart diagram illustrating one embodiment of a method for performing a memory test procedure.

FIG. 7 depicts a method 700 for performing a memory test procedure, according to embodiments of the disclosure. In some embodiments, the method 700 is performed by an advanced memory test device, such as the advanced memory test module 104 described above with reference to FIGS. 1-3 and 5-6. In further embodiments, the method 700 is performed by a processor executing program code, such as the processor 102 described above with reference to FIG. 1.

The method 700 begins with the advanced memory test device testing 702 successive blocks of memory in the address space in an increasing address order using a block test pattern. The block test pattern is the same length as the memory block and comprises a series of "0" and/or "1" bits. Neighboring bits may have the same value or may have alternating values. Examples of test patterns include the hexadecimal values of "AAAA", "6666", "CCCC", "FFFF", and the like. Patterns with alternating bits allow for quicker detection of memory storage error, leading to quicker diagnosis of memory faults. Testing 702 a block of memory includes writing the block test pattern to the memory block (the block test pattern being the same length as the memory block) and verifying that the value stored in the memory block matches the block test pattern. Verifying the value includes reading data stored in the memory block and determining whether the read values matches the block test pattern.

Next, the advanced memory test device tests 704 successive blocks of memory in the address space in an increasing address order using a pattern complement. The pattern complement is the inverse binary value of the block test pattern. For example, the hexadecimal block test pattern "0x FFFF FFFF FFFF FFFF" has a pattern complement (i.e., inverse) of "0x 0000 0000 0000 0000". Testing 704 a block of memory includes writing the complement of the block test pattern (the pattern complement) to the memory block and verifying that the value stored in the memory block matches the pattern complement. Verifying the value includes reading data stored in the memory block and determining whether the read values matches the pattern complement.

Next, the advanced memory test device tests 706 successive blocks of memory in the address space in a decreasing address order using the block test pattern. Testing 706 a block of memory includes writing the block test pattern to the memory block and verifying that the value stored in the memory block matches the block test pattern. Verifying the value includes reading data stored in the memory block and determining whether the read values matches the block test pattern.

Next, the advanced memory test device tests 708 successive blocks of memory in the address space in a decreasing address order using the pattern complement. Testing 708 a block of memory includes writing the pattern complement to the memory block and verifying that the value stored in the memory block matches the pattern complement. Verifying the value includes reading data stored in the memory block and determining whether the read values matches the pattern complement. The method 700 ends.

Figure 8:
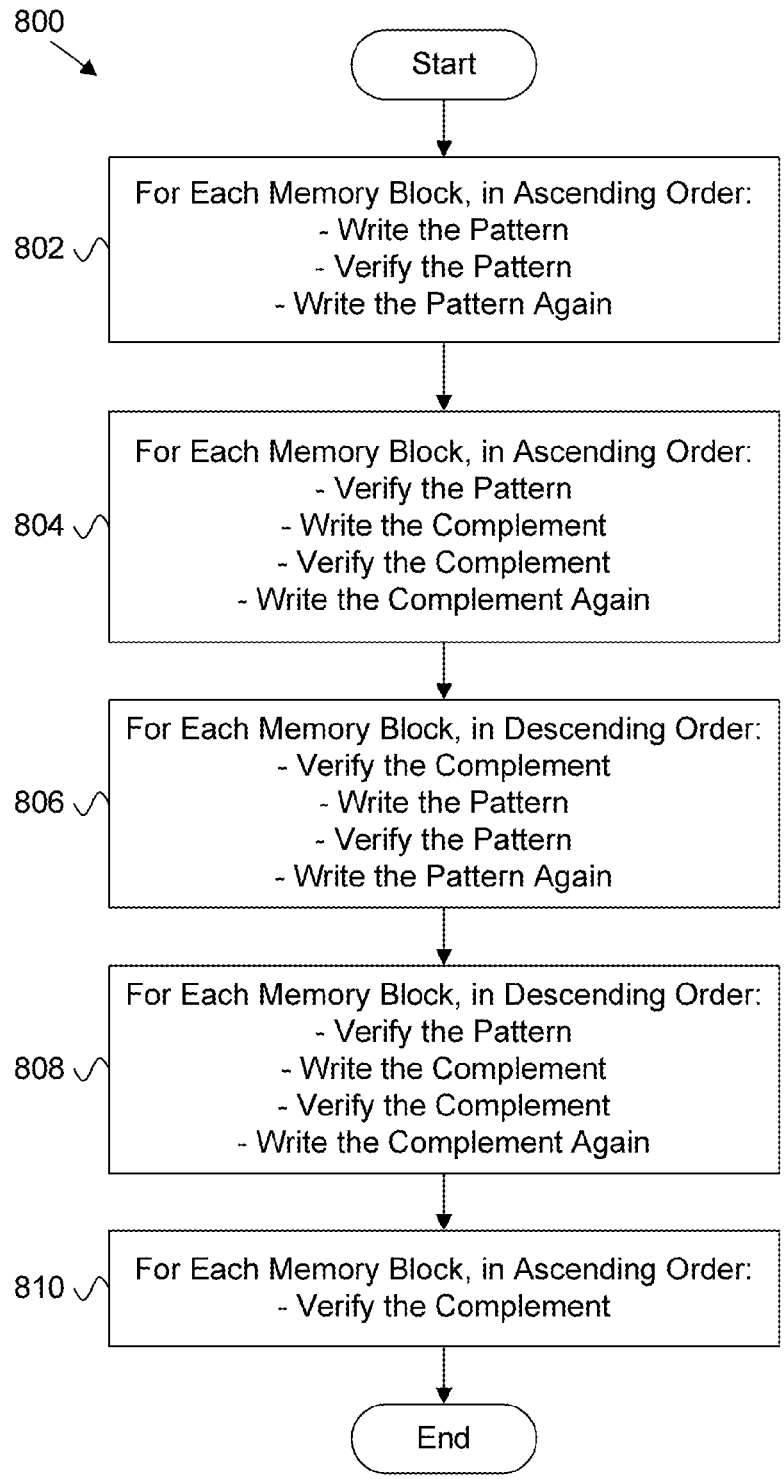
FIG. 8 is a schematic flow chart diagram illustrating another embodiment of a method for performing a memory test procedure.

FIG. 8 depicts a method 800 for performing a memory test procedure, according to embodiments of the disclosure. In some embodiments, the method 800 is performed by an advanced memory test device, such as the advanced memory test module 104 described above with reference to FIGS. 1-3 and 5-7. In further embodiments, the method 800 is performed by a processor executing program code, such as the processor 102 described above with reference to FIG. 1.

The method 800 begins with the advanced memory test device performing 802, for successive blocks of memory in the address space in an ascending address order, three consecutive operations consisting of: a write operation using a block test pattern, a verify operation using the block test pattern, and a second write operation using the block test pattern. Each write operation includes writing the block test pattern to a memory block, each verify operation includes reading the data stored in the memory blocks and determining whether the read data matches the block test pattern. The block test pattern is the same length as the memory block and comprises a series of "0" and/or "1" bits. Neighboring bits may have the same value or may have alternating values. Examples of test patterns include the hexadecimal values of "0xAAAA", "0x6666", "0xCCCC", "0xFFFF", and the like. Patterns with alternating bits allow for quicker detection of memory storage error, leading to quicker diagnosis of memory faults. Each of the three operations is performed on a block of memory before moving on to the next memory block.

The advanced memory test device next performs 804, for successive blocks of memory in the address space in an ascending address order, four consecutive operations consisting of: a verify operation using the block test pattern, a write operation using a pattern complement, a verify operation using the pattern complement, and a second write operation using the pattern complement. Each write operation includes writing the pattern complement to a memory block, each verify operation includes reading the data stored in the memory blocks and determining whether the read data matches the written values, i.e., one of the block test pattern and the pattern complement. The pattern complement is the inverse binary value of the block test pattern. For example, the hexadecimal block test pattern "0x AAAA AAAA AAAA AAAA" has a pattern complement (i.e., inverse) of "0x 5555 5555 5555 5555". By using both the block test pattern and the pattern complement, the memory test procedure ensures that all possible values are written to (and read from) each tested memory block. Each of the four operations is performed on a block of memory before moving on to the next memory block.

The advanced memory test device next performs 806, for successive blocks of memory in the address space in a descending address order, four consecutive operations consisting of: a verify operation using the pattern compliment, a write operation using the block test pattern, a verify operation using the block test pattern, and a second write operation using the block test pattern. Each write operation includes writing the block test pattern to a memory block, each verify operation includes reading the data stored in the memory blocks and determining whether the read data matches the written values, i.e., one of the block test pattern and the pattern complement. Each of the four operations is performed on a block of memory before moving on to the next memory block.

The advanced memory test device next performs 808, for each of successive blocks of memory in the address space in a descending address order, four consecutive operations consisting of: a verify operation using the block test pattern, a write operation using a pattern complement, a verify operation using the pattern complement, and a second write operation using the pattern complement. Each write operation includes writing the pattern complement to a memory block, each verify operation includes reading the data stored in the memory blocks and determining whether the read data matches the written values, i.e., one of the block test pattern and the pattern complement. Each of the four operations is performed on a block of memory before moving on to the next memory block.

The advanced memory test device next performs 810, for each of successive blocks of memory in the address space in an ascending order, a verify operation using the pattern compliment. Verifying the memory blocks value includes reading the data stored in the memory blocks and determining whether the read data matches the pattern complement. The method 800 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a processor;
a memory that stores code executable by the processor, the code comprising:
code that identifies an unreserved amount of a main memory;
code that requests a portion of the main memory based on the unreserved amount;
code that determines whether an allocated portion of the main memory includes non-contiguous memory addresses;
code that identifies an address space based on the allocated portion of the main memory, the allocated portion comprising a plurality of blocks of memory addresses;
code that performs, at least three times, a memory test procedure on the address space using a block pattern, wherein a first block pattern is used the first time, a second block pattern is used the second time, and a third block pattern is used the third time; and
code that determines the presence of a memory fault based on results of the memory test procedures.

2. The apparatus of claim 1, further comprising code that tracks errors detected during the memory test procedures, wherein the code that determines the presence of memory faults comprises code that determines the presence of a memory fault based on the tracked errors.

3. The apparatus of claim 1, further comprising:
code that clears the plurality of blocks of memory addresses, in response to identifying the address space; and
code that clears the plurality of blocks of memory addresses, in response to performing the memory test procedures on the address space using the first pattern.

4. The apparatus of claim 3, wherein the code that tests blocks of memory addresses of the address space comprises:
code that writes a value to each block of memory addresses, the written value being a values selected from the group consisting of the block pattern and the complement of the block pattern;
code that reads data values in each block of memory addresses; and
code that determines, for each block of memory addresses whether the read data values matches the written value.

5. The apparatus of claim 1, further comprising:
code that writes a complement of the second block pattern to the blocks of memory addresses in response to performing the memory test procedure using the first block pattern; and
code that writes a complement of the third block pattern to the blocks of memory addresses in response to performing the memory test procedure using the second block pattern.

6. The apparatus of claim 1, wherein the code that performs the memory test procedure using a block pattern comprises:
code that tests sequential blocks of memory addresses of the address space in an increasing manner using the block pattern;
code that tests sequential blocks of memory addresses of the address space in an increasing manner using a complement of the block pattern;

code that tests sequential blocks of memory addresses of the address space in a decreasing manner using the block pattern; and code that tests sequential blocks of memory addresses of the address space in a decreasing manner using the complement of the block pattern.

7. The apparatus of claim 1, wherein the first block pattern matches the second block pattern and the third block pattern is different than both the first block pattern and the second block pattern.

8. The apparatus of claim 1, wherein the the block pattern comprising a plurality of bits in a predetermined pattern of values and wherein the memory test procedure comprises writing a block pattern to a memory address within the address space and incrementing the memory address by an amount less than a length of the block pattern so that a successive written block pattern overlaps a previous written block pattern.

9. The apparatus of claim 1, wherein the determined memory fault is selected from the group comprising of a stuck-at fault, a transition fault, a coupling fault, a data retention fault, a read random fault, and an addressing fault.

10. A method comprising:
identifying, using a processor, an address space based on an allocated portion of main memory, the allocated portion comprising a plurality of blocks of memory addresses;
performing, at least three times, a memory test procedure on the address space using a block pattern, the block pattern comprising a plurality of bits in a predetermined pattern of values, wherein a first block pattern is used the first time, a second block pattern is used the second time, and a third block pattern is used the third time; and
tracking errors detected during the plurality of test procedures, wherein the memory test procedure comprises writing a block pattern to a memory address within the address space and incrementing the memory address by an amount less than a length of the block pattern so that a successive written block patterns overlaps a previous written block pattern.

11. The method of claim 10, further comprising determining the presence of a memory fault based on the tracked errors, wherein the determined memory fault is selected from the group comprising of a stuck-at fault, a transition fault, a coupling fault, a data retention fault, a read random fault, and an addressing fault.

12. The method of claim 10, further comprising:
clearing the plurality of blocks of memory addresses, in response to identifying the address space;
verifying that the plurality of blocks of memory addresses are cleared;
clearing the plurality of blocks of memory addresses, in response to performing the memory test procedures on the address space using the first pattern; and
verifying that the plurality of blocks of memory addresses are cleared.

13. The method of claim 10, further comprising:
writing a complement of the second block pattern to the blocks of memory addresses in response to performing the memory test procedure using the first pattern; and writing a complement of the third block pattern to the blocks of memory addresses in response to performing the memory test procedure using the second pattern.

14. The method of claim 10, wherein performing the memory test comprises:
testing sequential blocks of memory addresses of the address space in an increasing manner using a block pattern;
testing sequential blocks of memory addresses of the address space in an increasing manner using a complement of the block pattern;
testing sequential blocks of memory addresses of the address space in a decreasing manner using the block pattern; and
testing sequential blocks of memory addresses of the address space in a decreasing manner using the complement of the block pattern.

15. The method of claim 14, wherein identifying an address space based on an allocated portion of main memory comprises:
identifying an unreserved amount of the main memory;
requesting a portion of the main memory based on the unreserved amount; and
determining whether the allocated portion of the main memory includes non-contiguous memory addresses.

16. The method of claim 10, wherein each block of memory addresses has a size of eight bytes and the first block pattern, the second block pattern, and the third block pattern each have a size of eight bytes.

17. The method of claim 10, wherein performing the memory test procedure in the address space comprises testing a subset of the blocks of memory addresses of the address space using the block pattern.

18. A program product comprising a non-transitory computer readable storage medium that stores code executable by a processor to perform:
identifying an address space based on an allocated portion of the main memory, the allocated portion comprising a plurality of memory chunks;
selecting a subset of the address space;
performing, at least three times, a memory test procedure on selected subsets of the address space using a block pattern, wherein a first block pattern is used the first time, a second block pattern is used the second time, and a third block pattern is used the third time, wherein a new subset is selected between successive iterations of the memory test procedure;
tracking errors detected during the memory test procedures; and
determining the presence of a memory fault based on the tracked errors.

19. The program product of claim 18, wherein the code to perform a memory test procedure using a block pattern comprising code to perform:
testing sequential memory chunks in the address space using the block pattern; and
testing sequential memory chunks in the address space using the complement of the block pattern.

20. The program product of claim 18, wherein the first block pattern matches the second block pattern and the third block pattern is different than both the first block pattern and the second block pattern.

* * * * *